(12) United States Patent
Otsuji

(10) Patent No.: US 6,341,932 B1
(45) Date of Patent: Jan. 29, 2002

(54) PLATE FEEDING APPARATUS AND METHOD

(75) Inventor: Masahiko Otsuji, Kyoto (JP)

(73) Assignee: Dainippon Screen Mfg. Co., Ltd., Kyoto (JP)

( * ) Notice: Subject to any disclaimer, the term of this patent is extended or adjusted under 35 U.S.C. 154(b) by 0 days.

(21) Appl. No.: 09/589,107

(22) Filed: Jun. 8, 2000

(30) Foreign Application Priority Data

Jun. 14, 1999 (JP) .......................................... 11-166880

(51) Int. Cl.[7] .............................. B65H 1/26; B65H 3/08; B41F 27/12
(52) U.S. Cl. ...................... 414/403; 271/9.08; 414/277; 414/416.03; 414/797
(58) Field of Search .......................... 414/403, 416.03, 414/331.01, 797, 277; 271/9.08, 9.11

(56) References Cited

U.S. PATENT DOCUMENTS

| | | | |
|---|---|---|---|
| 5,201,506 A | * | 4/1993 | Kushima et al. ....... 271/9.08 R |
| 5,655,452 A | | 8/1997 | Blake et al. |
| 5,738,014 A | | 4/1998 | Rombult et al. |
| 5,788,455 A | | 8/1998 | Krupica et al. |
| 5,809,360 A | | 9/1998 | Blake et al. |

FOREIGN PATENT DOCUMENTS

JP 5294473 * 11/1993 ................ 271/9.08

* cited by examiner

Primary Examiner—Steven A. Bratlie
(74) Attorney, Agent, or Firm—McDermott, Will & Emery

(57) ABSTRACT

A plate feeding apparatus includes a slide mechanism for horizontally moving one of a plurality of cassettes, a lift mechanism for supporting and vertically moving the cassette horizontally moved by the slide mechanism, to a plate feed position for feeding plates to an image recording apparatus, a transport mechanism for transporting the plates to the image recording apparatus from the cassette moved to the plate feed position by the lift mechanism, and a strip sheet discharge mechanism for discharging strip sheets each disposed between an adjacent pair of the plates.

10 Claims, 10 Drawing Sheets

PLATE FEEDING APPARATUS AND METHOD

BACKGROUND OF THE INVENTION

1. Field of the Invention

The present invention relates to a plate feeding apparatus and method for feeding plates stored in a plurality of cassettes to an image recording apparatus for recording images on the plates.

2. Description of the Related Art

Four color plates of Y (yellow), M (magenta), C (cyan) and K (black) are used to produce color prints. Such plates are prepared by using an image recording apparatus called a CTP (Computer-To-Plate) machine which records images directly on the plates such as PS plates (Persennsitized Plates). This image recording apparatus records desired images on the plates by irradiating the plates with light beams modulated according to respective image signals of Y (yellow), M (magenta), C (cyan) and K (black).

A plate feeding apparatus for automatically feeding the plates to the image recording apparatus includes a cassette for storing the plates, and a transport mechanism for transporting the plates from the cassette to the image recording apparatus.

Where, for example, the image recording apparatus records images on plates of various sizes, or consecutively records images on a great number of plates, the plate feeding apparatus, preferably, is constructed for automatically feeding the plates from a plurality of cassettes to the image recording apparatus.

In a conventional measure taken to meet such a requirement, a plurality of plate feeding apparatus each including a cassette and a transport mechanism are installed and connected to the image recording apparatus. Plates are automatically fed from the plurality of cassettes to the image recording apparatus.

However, where the above construction is employed, the plurality of plate feeding apparatus and the image recording apparatus constitute an enlarged overall system that requires an extensive installation space. In addition, is the system per se is complicated and costly.

SUMMARY OF THE INVENTION

An object of the present invention, therefore, is to provide a plate feeding apparatus and method for feeding plates from a plurality of cassettes to an image recording apparatus easily without requiring an enlarged construction.

The above object is fulfilled, according to the present invention, by a plate feeding apparatus for feeding plates stored in a plurality of cassettes to an image recording apparatus for recording images on the plates, comprising:

(1) a plurality of cassettes stacked vertically;

(2) a slide mechanism for horizontally moving one of the cassettes;

(3) a lift mechanism for supporting and vertically moving the one of the cassettes horizontally moved by the slide mechanism, to a plate feed position for feeding plates to the image recording apparatus; and (4) a transport mechanism for transporting the plates to the image recording apparatus from the one of the cassettes moved to the plate feed position by the lift mechanism.

This plate feeding apparatus is constructed to horizontally slide and then vertically move a cassette to place the cassette in the plate feed position for feeding plates to the image recording apparatus. Thus, the plate feeding apparatus has a compact construction, and yet is capable of feeding plates from a plurality of cassettes to the image recording apparatus with ease.

In a preferred embodiment of the invention, the slide mechanism includes a first guide for horizontally guiding each of the cassettes, a first pinion rotatable by a motor, and a rack attached to a wall of each of the cassettes and meshed with the first pinion.

Preferably, the lift mechanism includes a second guide for horizontally guiding one of the cassettes, the first guide and the second guide being aligned by a vertical movement of the lift mechanism per se when the cassette is moved horiontally.

The lift mechanism may further include a second pinion rotatable by a motor, the first pinion and the second pinion being spaced from each other by a distance less than a total length of each rack when the first guide and the second guide are aligned.

In another preferred embodiment, the plate feeding apparatus further comprises a strip sheet discharge mechanism for discharging strip sheets each disposed between an adjacent pair of the plates from the cassette placed in the plate feed position.

In another aspect of the invention, a plate feeding apparatus for feeding plates stored in a plurality of cassettes to an image recording apparatus for recording images on the plates, comprises:

(1) a multiple cassette station having a plurality of cassettes stacked vertically;

(2) a slide mechanism for horizontally moving one of the cassettes stacked in the multiple cassette station, the slide mechanism including:

first guides corresponding in number to the cassettes for horizontally guiding the cassettes;

racks each attached to a wall of one of the cassettes; and first pinions corresponding in number to the cassettes and each rotatable by a motor while being meshed with one of the racks;

(3) a lift mechanism for supporting and vertically moving the one of the cassettes horizontally moved by the slide mechanism, to a plate feed position for feeding plates to the image recording apparatus, the lift mechanism including:

a lift member vertically movable by a motor;

a second guide attached to the lift member to be movable into alignment with one of the first guides when the one of the cassettes is moved horizontally by the slide mechanism, to cooperate with the one of the first guides for horizontally guiding the one of the cassettes; and a second pinion attached to the lift member and rotatable by a motor while being meshed with one of the racks, the first pinion and the second pinion being spaced from each other by a distance less than a total length of each rack when one of the first guides and the second guide are aligned; and (4) a transport mechanism for transporting the plates to the image recording apparatus from the one of the cassettes moved to the plate feed position by the lift mechanism.

In a further aspect of the invention, there is provided a plate feeding method for feeding plates stored in a plurality of cassettes to an image recording apparatus for recording images on the plates, by sliding the cassettes with a slide mechanism and then vertically moving the cassettes with a lift mechanism. This plate feeding method comprises:

(1) a plate depositing step for depositing plates in a plurality of cassettes stacked vertically;

(2) a sliding step for horizontally moving one of the cassettes in a multiple cassette station, the one of the cassettes having a plate to be used for recording images;

(3) a vertically moving step for vertically moving, with the lift mechanism, the one of the cassettes having been moved horizontally, to a plate feed position for feeding the plates to the image recording apparatus; and (4) a plate transporting step for picking up the plate, with a transport mechanism, from the one of the cassettes placed in the plate feed position, and transporting the plates to the image recording apparatus.

Other features and advantages of the present invention will be apparent from the following detailed description of the embodiments of the invention.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

An embodiment of the present invention will be described hereinafter with reference to the drawings.

Figure 1:
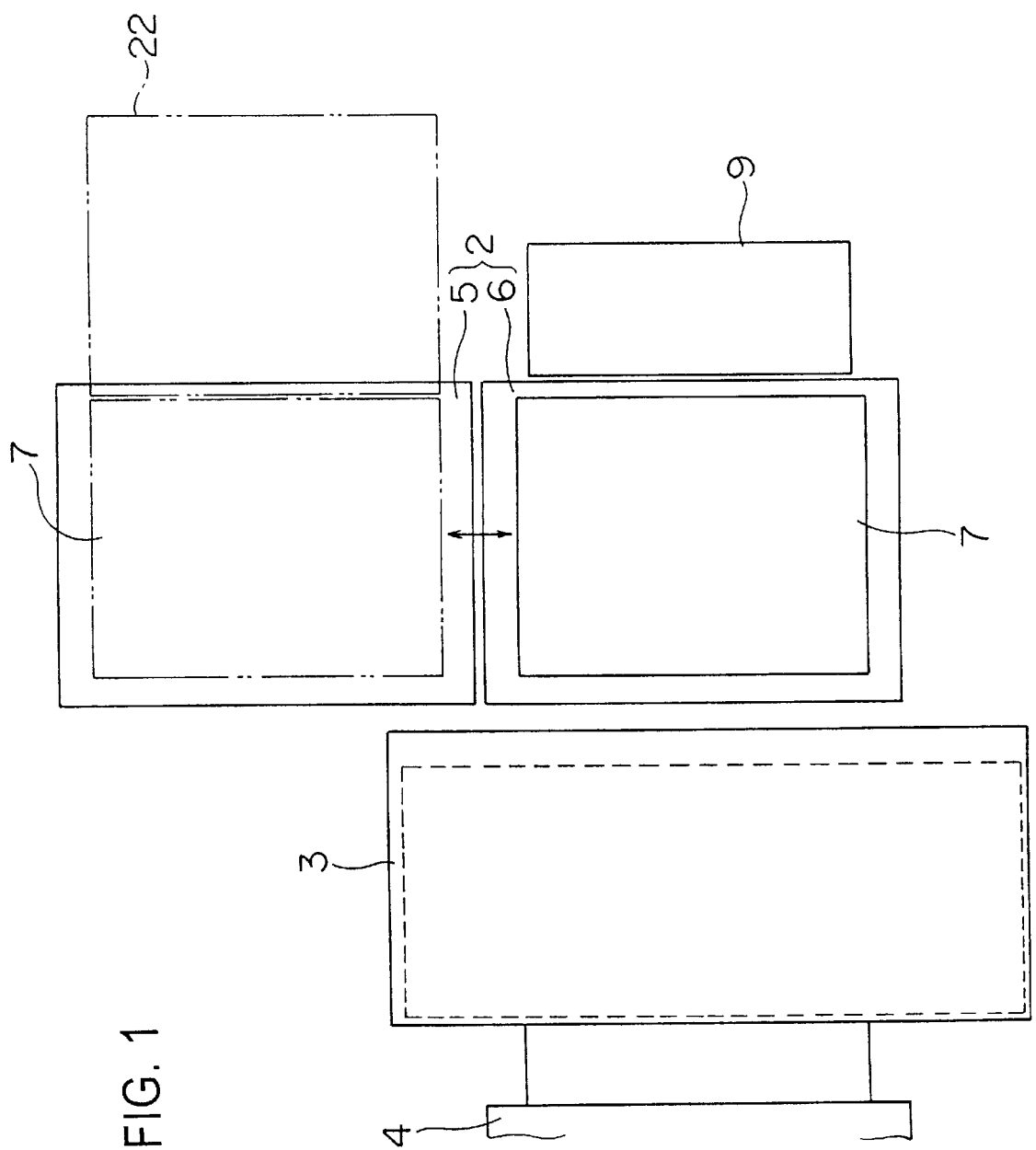
FIG. 1 is a plan view of an image recording system.
Figure 2:
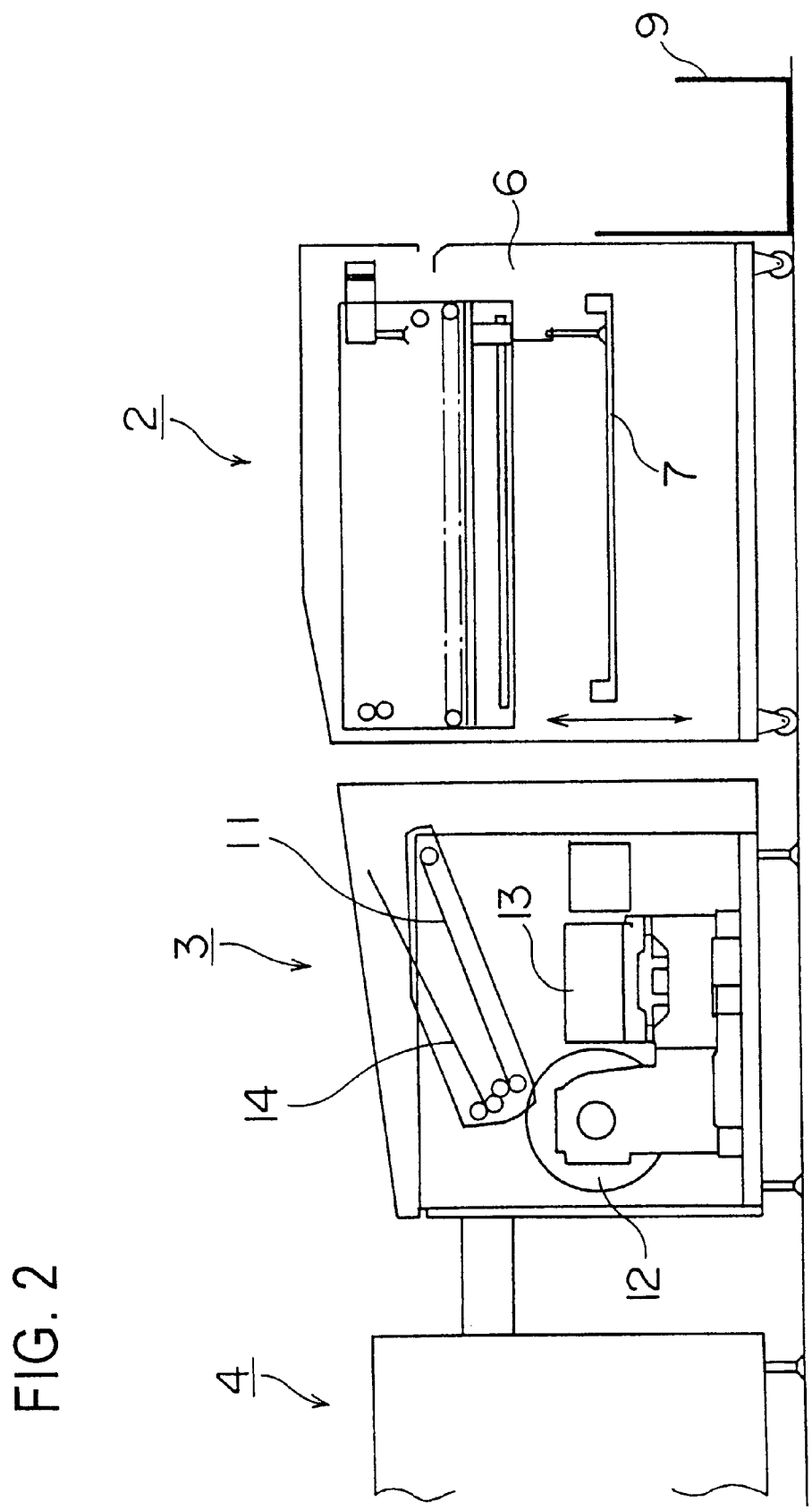
FIG. 2 is a front view of the image recording system.

FIG. 1 is a plan view of an image recording system to which the present invention is applied. FIG. 2 is a front view and FIG. 3 a side view of the image recording system. The image recording system is composed of a plate feeding apparatus 2 embodying the present invention, an image recording apparatus 3 and an automatic developing apparatus 4.

The plate feeding apparatus 2 is operable to feed plates stored in a plurality of cassettes 7 to the image recording apparatus 3. The plate feeding apparatus 2 includes a multiple cassette station 5 having the plurality of cassettes 7 arranged one over the other, and an auto loader 6 for transporting plates from one of the cassettes 7 placed in a plate feeding position to the image recording apparatus 3.

Figure 3:
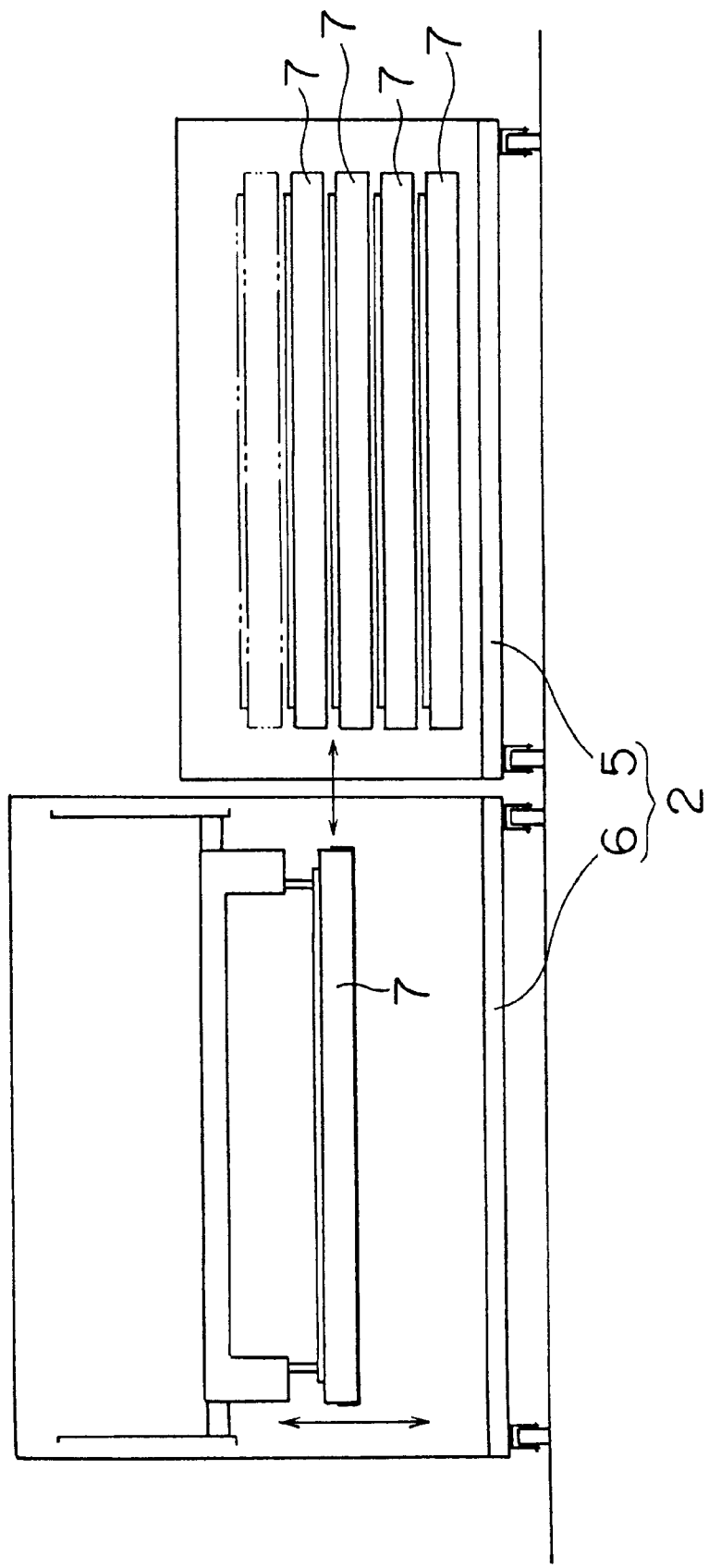
FIG. 3 is a right side view of the image recording system.

When feeding the plate stored in the cassettes 7 to the image recording apparatus 3, one of the cassettes 7 is first moved horizontally from the multiple cassette station 5 to the auto loader 6. FIG. 3 shows a state where an uppermost one of the cassettes 7 has moved to the auto loader 6. The construction of the plate feeding apparatus 2 will be described in detail hereinafter.

The image recording apparatus 3 is operable to record images on the plates fed from the plate feeding apparatus 2. As shown in FIG. 2, the image recording apparatus 3 includes a feed passage 11 for receiving the plates from the plate feeding apparatus 2, a recording drum 12 rotatable with the plates mounted peripherally thereof after being fed through the feed passage 11, a recording head 13 for irradiating the plates mounted peripherally of the recording drum 12 with light beams modulated according to image signals, and a discharge passage 14 for transporting the recorded plates in a switchback fashion to the automatic developing apparatus 4 in the succeeding stage.

The automatic developing apparatus 4 is operable to develop the recorded plates with treating solutions and then drying the plates. For this purpose, the developing apparatus 4 includes treating solution tanks and a drying section not shown.

In this image recording system, the plates stored in each cassette 7 in the multiple cassette station 5 of plate feeding apparatus 2 are transported to the image recording apparatus 3 by the auto loader 6 of plate feeding apparatus 2.

Each plate is wrapped around the recording drum 12 through the feeding passage 11 of image recording apparatus 3. In this state, the recording drum 12 rotates at high speed. The recording head 13 emits light beams modulated according to image signals to the surface of the plate rotating as wrapped around the recording drum 12. As a result, a desired image is recorded on the surface of the plate.

The plate with the image recorded thereon is transported through the discharge passage 14 of image recording apparatus 3 to the automatic developing apparatus 4. Then, the plate is developed in the treating solution tanks, dried in the drying section, and discharged from the automatic developing apparatus 4.

The construction of plate feeding apparatus 2 according to the present invention will be described next.

This plate feeding apparatus 2 includes a slide mechanism for horizontally moving one of the cassettes 7, a lift mechanism for supporting and vertically moving the cassette 7 horizontally moved by the slide mechanism, to the plate feed position for feeding the plates to the image recording apparatus 3, a transport mechanism for transporting the plates to the image recording apparatus 3 from inside the cassette 7 placed in the plate feed position by the lift mechanism, and a strip sheet discharge mechanism for discharging strip sheets interposed between the plates. The slide mechanism is disposed in the multiple cassette station 5 of plate feeding apparatus 2. The lift mechanism, transport mechanism and strip sheet discharge mechanism are disposed in the auto loader 6 of plate feeding apparatus 2.

Figure 4:
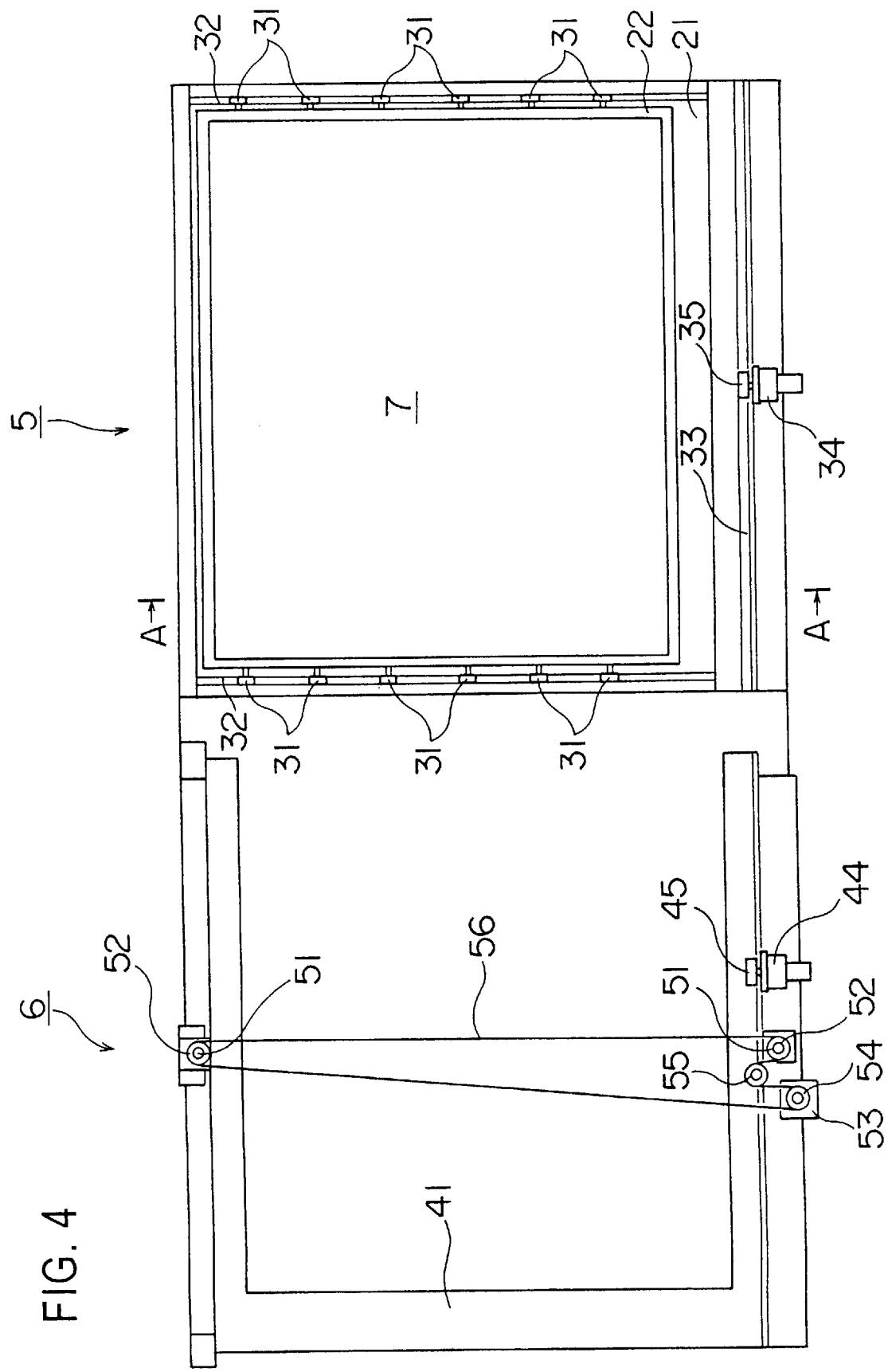
FIG. 4 is a plan view of a slide mechanism and a lift mechanism of a plate feeding apparatus.
Figure 5:
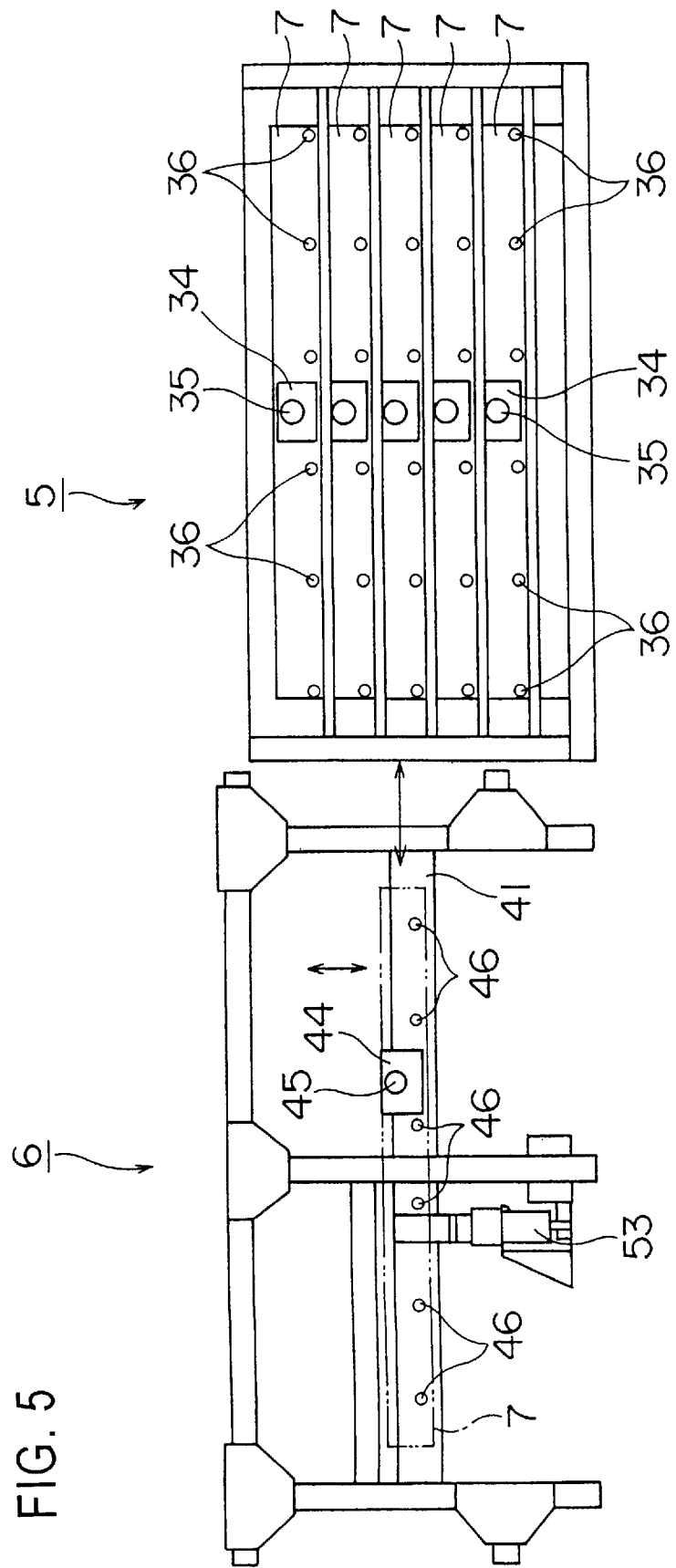
FIG. 5 is a side view of the slide mechanism and lift mechanism.
Figure 6:
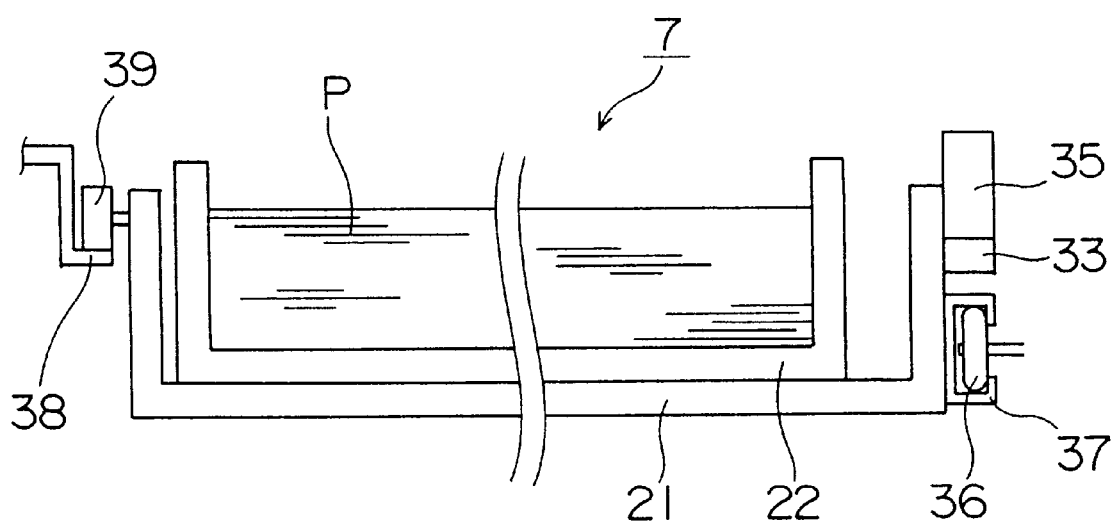
FIG. 6 is an enlarged view showing a relationship between a cassette and the slide mechanism.

The constructions of the cassettes 7 and the slide mechanism and lift mechanism in the plate feeding apparatus 2 will be described first. FIG. 4 is a plan view showing the slide mechanism and lift mechanism in the plate feeding apparatus 2 having the multiple cassette station 5 and auto loader 6. FIG. 5 is a side view thereof. FIG. 6 is an enlarged view showing a relationship between each cassette 7 and slide mechanism. FIG. 6 shows a section taken on line A—A of FIG. 4.

As shown in FIG. 5, the cassettes 7 are arranged in five stages in the multiple cassette station 5. As shown in FIGS.

4 and 6, each of the cassettes 7 in five stages includes an outer tray 21, and an inner tray 22 mounted in the outer tray 21. As shown in FIG. 6, plates P are stacked with strip sheets (not shown in FIG. 6), described hereinafter, interposed therebetween in the inner tray 22.

As shown in FIG. 4, numerous rolls 31 are arranged along side surfaces of inner tray 22. These rolls 31 are supported through contact with a pair of rails 32 disposed on upper surfaces of outer tray 21. Consequently, the inner tray 22 is reciprocable relative to the outer tray 21 vertically in FIG. 4 (perpendicular to the planes of FIGS. 5 and 6).

As shown in FIGS. 4 and 6, the outer tray 21 of each cassette 7 has a rack 33 attached to an outer side surface thereof. The rack 33 is meshed with a pinion 35 rotatable by a motor 34 fixed to the multiple cassette station 5.

As shown in FIG. 6, a receiving member 37 is attached to the same outer side surface of the outer tray 21 of each cassette 7 for engaging guide rollers 36 in one row. The multiple cassette station 5 has such guide rollers 36 arranged in five rows corresponding to the positions of cassettes 7. Further, the outer tray 21 of each cassette 7 has rollers 39 attached to the opposite outer side surface thereof. The rollers 39 are supported by one of five support rails 38 fixed to the multiple cassette station 5 and corresponding to the positions of cassettes 7.

When the pinion 35 is rotated by the motor 34, the rack 33 attached to the outer tray 21 is driven sideways to move the cassette 7 rightward or leftward in FIGS. 4 and 5 (i.e. in a direction perpendicular to the plane of FIG. 6). As a result, each cassette 7 moves horizontally from the multiple cassette station 5 toward the auto loader 6.

The guide rollers 36 and support rails 38 constitute the first guide in this invention.

The auto loader 6 includes a lift 41 for supporting a cassette 7 having moved horizontally from the multiple cassette station 5. As shown in FIG. 4, the lift 41 is approximately U-shaped in plan view.

The lift 41 has, arranged along one side surface thereof, guide rollers 46 similar to the guide rollers 36 in the multiple cassette station 5. The lift 41 has, attached to the opposite side surface thereof, a support rail (not shown) similar to the support rails 38 in the multiple cassette station 5. Further, the lift 41 includes a motor 44 and a pinion 45 similar to the motors 34 pinions 35 in the multiple cassette station 5.

The guide rollers 46 and the support rail constitute the second guide in this invention.

The lift 41 has threaded portions meshed with a pair of ball screws 51. Each of these ball screws 51 has a pulley 52 attached to a proximal end thereof. A synchronizing belt 56 is wound around these pulleys 52, a drive pulley 54 connected to a lift motor 53, and an auxiliary pulley 55. Thus, the lift 41 is vertically movable with rotation of the ball screws 51 caused by the lift motor 53.

Figure 7:
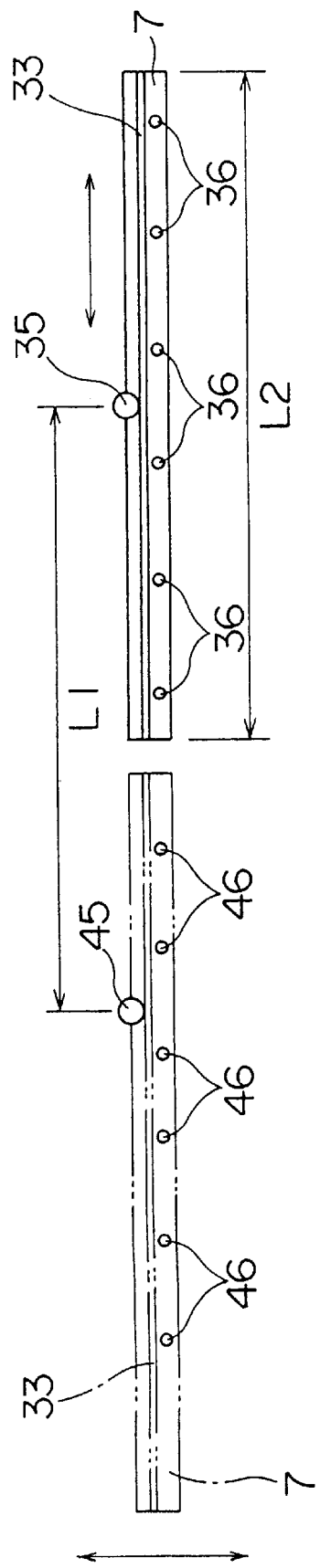
FIG. 7 is a side view showing a positional relationship between guide rollers and pinions.

FIG. 7 is a side view showing a positional relationship between the guide rollers 36, 46 and pinions 35, 45. In FIG. 7, the lift 41 is in a position sideways from one of the cassettes 7 for horizontally moving this cassette 7.

In this state, the guide rollers 36 in the multiple cassette station 5 and the guide rollers 46 in the auto loader 6 are in alignment. Though not shown, the support rail 38 in the multiple cassette station 5 and the support rail in the auto loader 6 also are in alignment. Further, the pinion 35 in the multiple cassette station 5 and the pinion 45 in the auto loader 6 are located at the same height. The pinion 35 and pinion 45 have a distance L1 therebetween which is smaller than the length L2 of the rack 33 attached to the cassette 7.

In this state, the pinion 35 is rotated by the motor 34 in the multiple cassette station 5, and the pinion 45 rotated by the motor 44 in the auto loader 6. Then, the cassette 7, driven by the pinion 35 through the rack 33 and guided by the guide rollers 36 and support rail 38 in the multiple cassette station 5, starts moving from the multiple cassette station 5 to the auto loader 6.

Once the forward end of cassette 7 advances into the auto loader 6, the cassette 7 is guided by the guide rollers 46 and the support rail provided on the lift 41 in the auto loader 6. The rack 33 of cassette 7 meshes with the pinion 45 in the auto loader 6 to be driven by the pinion 45. Subsequently, the rack 33 moves out of mesh with the pinion 35 in the multiple cassette station 5.

After the rack 33 is disengaged from the pinion 35 in the multiple cassette station 5, the cassette 7 is driven by the pinion 45 in the auto loader 6 to move to a position shown in a two-dot chain line in FIG. 7. In this state, the cassette 7 is supported by the lift 41.

Subsequently, the lift motor 53 vertically moves the lift 41 with the cassette 7 to a plate feed position shown in a phantom line in FIG. 5. The plate feed position is a position from which the plates in the cassette 7 are transported toward the image recording apparatus 3 by the transport mechanism described hereinafter.

Figure 8:
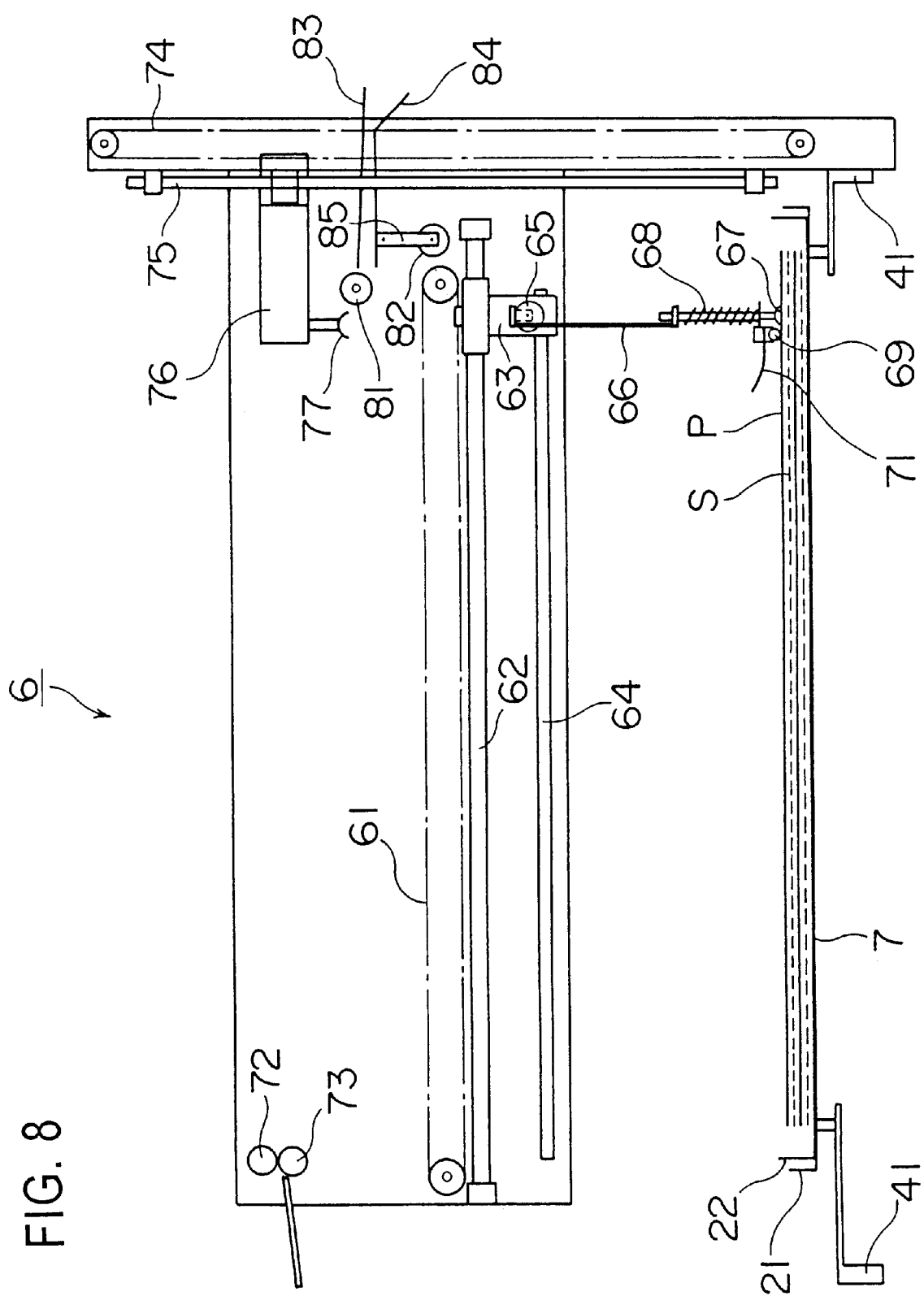
FIG. 8 is a side view of a transport mechanism and a strip sheet discharge mechanism.
Figure 9:
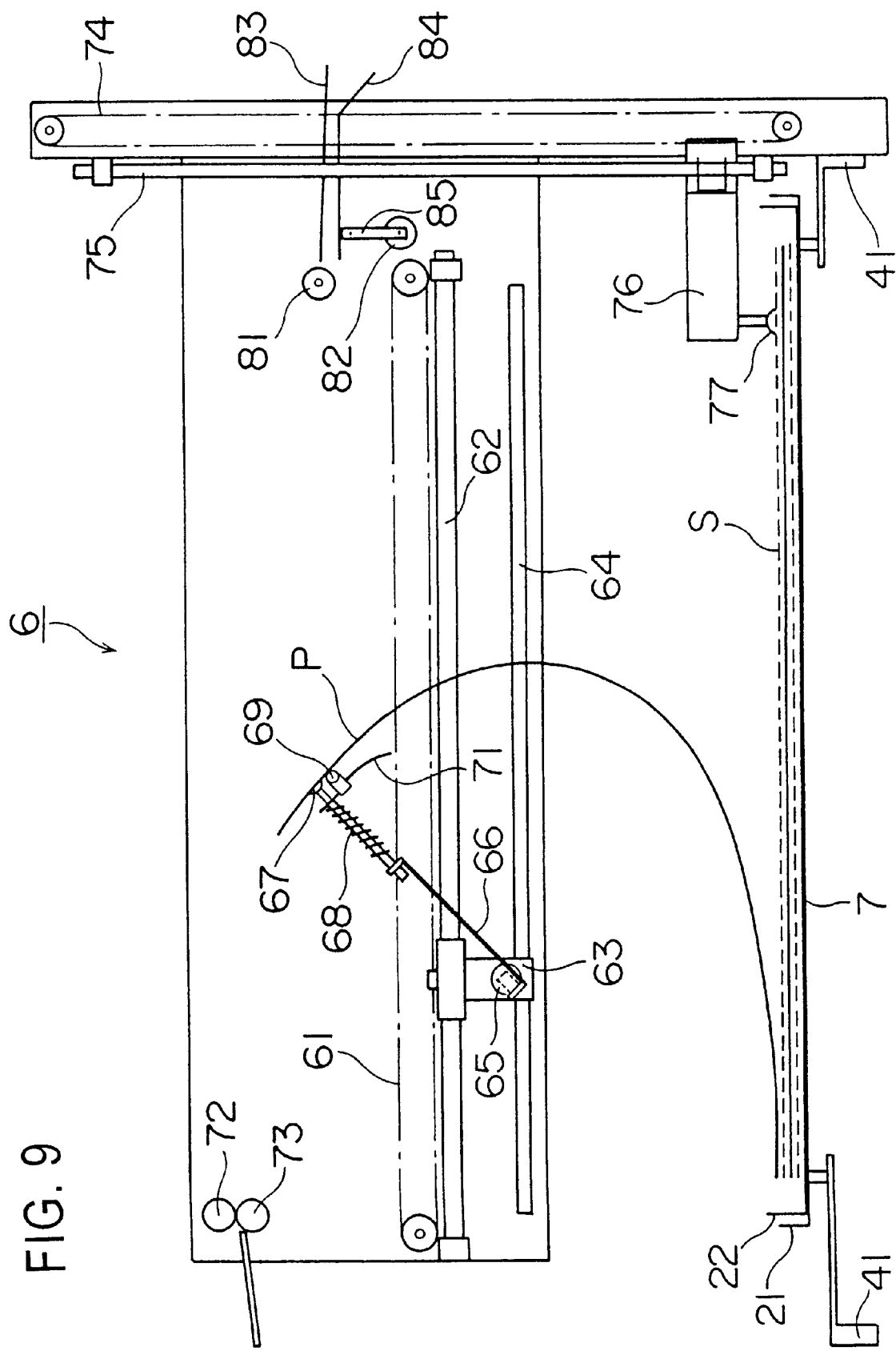
FIG. 9 is another side view of the transport mechanism and strip sheet discharge mechanism.
Figure 10:
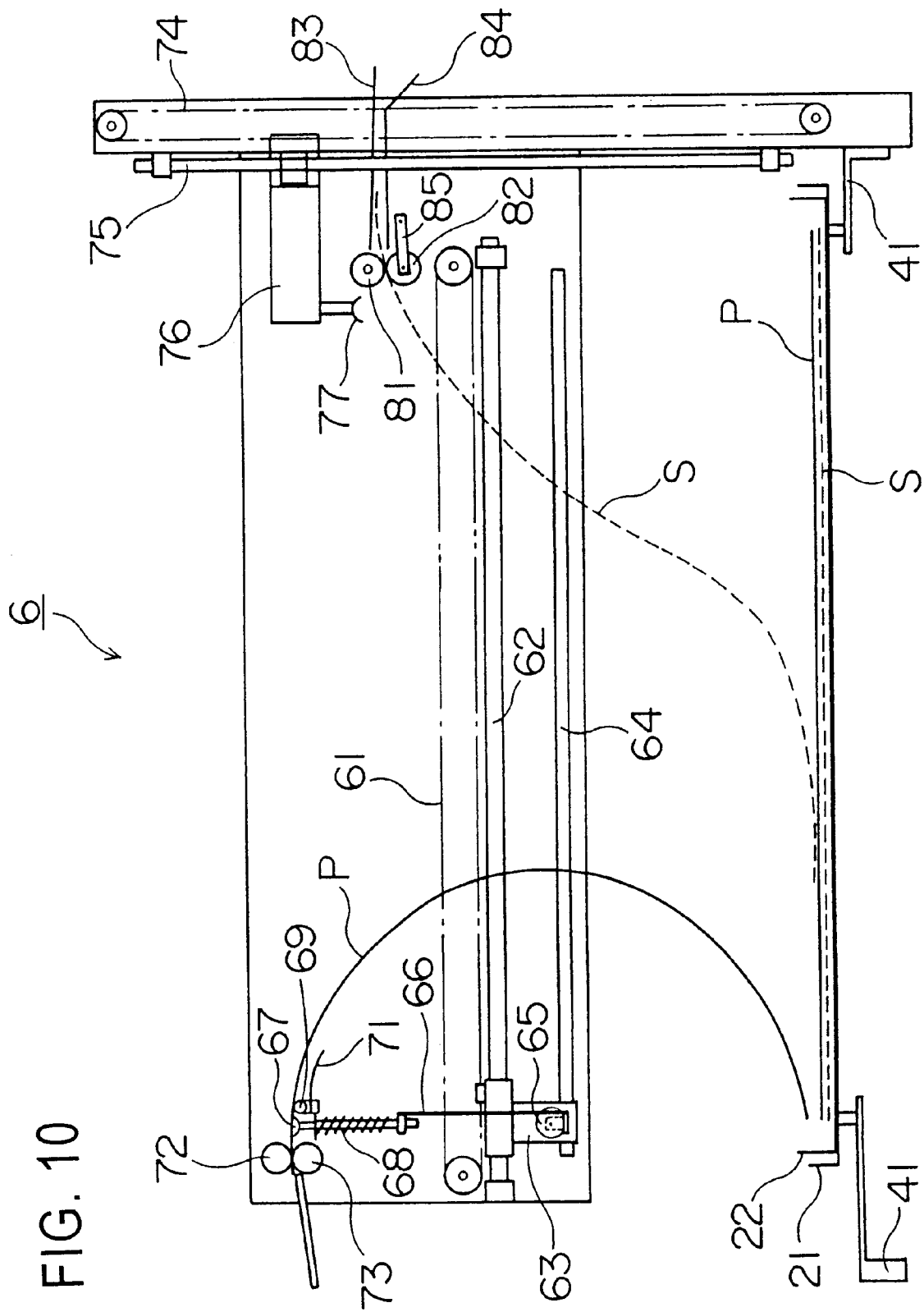
FIG. 10 is yet another side view of the transport mechanism and strip sheet discharge mechanism.

The constructions of the transport mechanism and strip sheet discharge mechanism will be described next. FIGS. 8 through 10 are side views of the transport mechanism and strip sheet discharge mechanism provided in the auto loader 6 of plate feeding apparatus 2. These figures schematically show a cassette 7 located in the plate feed position.

The transport mechanism for transporting plates P to the image recording apparatus 3 from the cassette 7 having moved to the plate feed position includes a slider 63 movable along a guide rail 62 by an endless chain 61 rotatable by a motor not shown. The slider 63 has a pinion 65 attached thereto and meshed with a rack 64 extending parallel to the guide rail 62. The pinion 65 has an arm 66 fixed thereto. The arm 66 has, attached to a distal end thereof through a spring 68, a suction pad 67 for sucking and picking up each plate P, and a support roller 69 and a support blade 71 for supporting the plate P at a lower surface thereof as the plate P is transported.

With this transport mechanism, when the motor now shown drives the slider 63 leftward from the position shown in FIG. 8, the arm 66 swings about the axis of pinion 65 as shown in FIGS. 9 and 10. Thus, when the motor now shown drives the slider 63 leftward with the suction pad 67 sucking the plate P in the state shown in FIG. 8, the plate P sucked by the suction pad 67 is tucked up into a U-shaped form as shown in FIG. 9. Subsequently, as shown in FIG. 10, the raised, forward end of plate P is pinched between a pair of transport rollers 72 and 73 for transporting the plate P toward the image recording apparatus 3.

The strip sheet discharge mechanism for discharging the strip sheets interposed between the plates P includes a lift 76 vertically movable along a guide rail 75 by an endless chain 74 rotatable by a motor not shown. The lift 76 has a suction pad 77 for sucking and picking up each strip sheet S.

A pair of discharge rollers 81, 82 and guides 83, 84 are disposed adjacent an upper stroke end of lift 76 for discharging the strip sheet S suction-supported by the suction pad 77 into a strip sheet receptacle 9 (FIGS. 1 and 2). One of the discharge rollers 81 is fixed to the auto loader 6, while the other discharge roller 82 is attached to a distal end of an arm 85 pivotable about a support axis secured to the auto loader 6.

When the suction pad 67 of the transport mechanism begins to pick up a plate P, the lift 76 of the strip sheet discharge mechanism stands by at the upper stroke end as shown in FIG. 8. When the suction pad 67 has begun to transport the forward end of plate P toward the pair of transport rollers 72 and 73, as shown in FIG. 9, the lift 76 descends to a lower stroke end whereupon the suction pad 77 picks up an end region of strip sheet S.

Subsequently, the lift 76 ascends with the suction pad 77 suction-supporting the end region of strip sheet S. As shown in FIG. 10, the arm 85 makes a pivotal movement whereby the discharge rollers 81 and 82 pinch the end of strip sheet S therebetween. The discharge rollers 81 and 82 then transport the strip sheet S and discharge the strip sheet S into the strip sheet receptacle 9.

With the plate feeding apparatus 2 having the construction described above, plates P of different sizes or the same size are stacked beforehand in each of the cassettes 7 stored in the five stages in the multiple cassette station 5. At this time, the strip sheets S are inserted between adjacent plates P.

When placing the plates P in each cassette 7, the inner tray 22 may be moved relative to the outer tray 21 to draw only the inner tray 22 out of the multiple cassette station 5 as shown in a two-dot chain line in FIG. 1.

The plate feeding apparatus 2 transports the plates P in this state to the image recording apparatus 3. First, the lift 41 in the auto loader 6 is vertically moved to a position opposed to a selected cassette 7. Then, the motor 34 in the multiple cassette station 5 is operated to rotate the pinion 35, and the motor 44 in the auto loader 6 is operated to rotate the pinion 45. As a result, the selected cassette 7 horizontally moves to a position to be supported by the lift 41 in the auto loader 6.

Subsequently, the lift motor 53 is operated to raise or lower the lift 41 to the position for feeding the plates P.

The suction pad 67 sucks and picks up an end of plate P in the cassette 7 having moved to the position for feeding the plates P, and transports the plate P to the image recording apparatus 3. In parallel with this operation, the suction pad 77 sucks and picks up an end of strip sheet S, and discharges the strip sheet S into the strip sheet receptacle 9.

Various types of plates P are commercially available, such as those of different weights, sizes, shapes and materials. The image recording apparatus 3 can cope with certain types of plates P. That is, the recording drum 12 mounted in the image recording apparatus 3 has plate clamps, not shown, movable circumferentially of the recording drum 12 to fix different size plates P in place.

Plate size is varied, for example, according to the sizes of images to be recorded. The sizes of images to be recorded are communicated to the image recording apparatus 3 and plate feeding apparatus 2 by a device [i.e. RIP(Raster Image Processor)] that creates image data (bit map data) having a form processable by the image recording apparatus 3. Such plural types of plates P are stored as sorted according to type in the plurality of cassettes 7 in the plate feeding apparatus 2.

When the RIP noted above indicates a desired size of plates P, the image recording apparatus 3 selects a cassette 7 storing that size of plates P from among the plurality of cassettes 7, and instructs the plate feeding apparatus 2 to feed that cassette 7. Upon receipt of this instruction, the plate feeding apparatus 2 moves the cassette 7 storing the plates P of the size corresponding to the selected image size, from the multiple cassette station 5 to the plate feed position in the auto loader 6.

This operation is carried out in the following specific sequence. First, the lift motor 53 is rotated to raise or lower the lift 41 to a height opposed to the cassette 7 storing the desired size plates P. Next, the motors 34 and 44 are rotated. Then, the cassette 7 storing the desired size plates P horizontally moves, under the guiding action of guide rollers 36, 46 and support rail 38, to the position to be supported by the lift 41. The lift motor 53 is rotated again to raise or lower the lift 41 to the plate feed position. It is now possible to feed the desired size plates P to the image recording apparatus 3.

Subsequently, the plates P are successively transported from the cassette 7 to the image recording apparatus 3 until plates P of a different size are required or until the plates P in this cassette 7 are exhausted.

In this way, the plates P are successively transported from the cassette 7 in the auto loader 6 to the image recording apparatus 3. When all the plates P have been transported from the cassette 7 in the auto loader 6 (or when plates P of a different size are required), this cassette 7 is returned to the multiple cassette station 5, and then a new cassette 7 is moved from the multiple cassette station 5 to the auto loader 6 (i.e. a cassette changing operation).

First, the image recording apparatus 3 notifies the plate feeding apparatus 2 a size of plates P to be used next. This step may be omitted when the size of plates P to be used is the same as that of the plates P used before.

Next, the lift motor 53 is rotated to raise or lower the cassette 7 so that the cassette guide rollers 46 are level with guide rollers 36 not supporting a cassette 7 in the multiple cassette station 5. Next, the empty cassette 7 in the auto loader 6 is moved horizontally to the multiple cassette station 5 to be deposited therein. Subsequently, a cassette 7 having the required size plates P is transported from the multiple cassette station 5 to the auto loader 6 in the sequence described hereinbefore. As a result, the required size plates P may be fed to the image recording apparatus 3.

The steps necessary for this cassette changing operation, such as an indication as to an image size, selection of a necessary cassette 7, vertical movement of lift 41 and movement of cassettes 7, are all performed automatically without requiring a manual operation.

As described above, this plate feeding apparatus 2 is capable of successively feeding such numerous plates P as requires one or more cassettes, and varied types of plates P different in size or weight, to the image recording apparatus 3 without requiring a manual operation.

This plate feeding apparatus 2 moves one of the cassettes 7 stored in a plurality of stages out to the plate feed position, and picks up plates P in that position. A strip sheet removing mechanism need not be provided for each cassette 7. Thus, the plate feeding apparatus 2 has a simplified construction.

The plate feeding apparatus 2 described hereinbefore has a simple and compact overall construction, and yet is capable of feeding plates P from the five cassettes 7 to the image recording apparatus 3 with ease.

When feeding plates P from the plurality of cassettes 7 to the image recording apparatus 3, all the cassettes 7 need not be raised or lowered. Thus, the drive mechanism and the like may be small and inexpensive, compared with a case of raising and lowering the plurality of cassettes 7 storing numerous heavy plates P.

The present invention may be embodied in other specific forms without departing from the spirit or essential attributes thereof and, accordingly, reference should be made to the appended claims, rather than to the foregoing specification, as indicating the scope of the invention.

This application claims priority benefit under 35 U.S.C. Section 119 of Japanese Patent Application No. 11-166880 filed in the Japanese Patent Office on Jun. 14, 1999, the entire disclosure of which is incorporated herein by reference.

What is claimed is:

1. A plate feeding apparatus for feeding plates stored in a plurality of cassettes to an image recording apparatus for recording images on the plates, comprising:

(1) a plurality of cassettes stacked vertically;

(2) a slide mechanism for horizontally moving one of said cassettes;

(3) a lift mechanism for supporting and vertically moving said one of said cassettes horizontally moved by said slide mechanism, to a plate feed position for feeding plates to said image recording apparatus; and (4) a transport mechanism for transporting said plates to said image recording apparatus from said one of said cassettes moved to said plate feed position by said lift mechanism.

2. A plate feeding apparatus as defined in claim 1, wherein said slide mechanism includes:

a first guide for horizontally guiding each of said cassettes;

a first pinion rotatable by a motor; and a rack attached to a wall of each of said cassettes and meshed with said first pinion.

3. A plate feeding apparatus as defined in claim 2, wherein said lift mechanism includes a second guide for horizontally guiding said one of said cassettes, said first guide and said second guide being aligned by a vertical movement of said lift mechanism per se when said one of said cassettes is moved horizontally.

4. A plate feeding apparatus as defined in claim 3, wherein said lift mechanism further includes a second pinion rotatable by a motor, said first pinion and said second pinion being spaced from each other by a distance less than a total length of said rack when said first guide and said second guide are aligned.

5. A plate feeding apparatus as defined in claim 4, further comprising a strip sheet discharge mechanism for discharging strip sheets each disposed between an adjacent pair of said plates from said one of said cassettes placed in said plate feed position.

6. A plate feeding apparatus for feeding plates stored in a plurality of cassettes to an image recording apparatus for recording images on the plates, comprising:

(1) a multiple cassette station having a plurality of cassettes stacked vertically;

(2) a slide mechanism for horizontally moving one of said cassettes stacked in said multiple cassette station, said slide mechanism including:

first guides corresponding in number to said cassettes for horizontally guiding said cassettes;

racks each attached to a wall of one of said cassettes; and first pinions corresponding in number to said cassettes and each rotatable by a motor while being meshed with one of said racks;

(3) a lift mechanism for supporting and vertically moving said one of said cassettes horizontally moved by said slide mechanism, to a plate feed position for feeding plates to said image recording apparatus, said lift mechanism including:

a lift member vertically movable by a motor;

a second guide attached to said lift member to be movable into alignment with one of said first guides when said one of said cassettes is moved horizontally by said slide mechanism, to cooperate with said one of said first guides for horizontally guiding said one of said cassettes; and a second pinion attached to said lift member and rotatable by a motor while being meshed with one of said racks, said first pinion and said second pinion being spaced from each other by a distance less than a total length of each rack when said one of said first guides and said second guide are aligned; and (4) a transport mechanism for transporting said plates to said image recording apparatus from said one of said cassettes moved to said plate feed position by said lift mechanism.

7. A plate feeding apparatus as defined in claim 6, further comprising a strip sheet discharge mechanism for discharging strip sheets each disposed between an adjacent pair of said plates from said one of said cassettes placed in said plate feed position.

8. A plate feeding method for feeding plates stored in a plurality of cassettes to an image recording apparatus for recording images on the plates, by sliding the cassettes with a slide mechanism and then vertically moving the cassettes with a lift mechanism, said plate feeding method comprising:

(1) a plate depositing step for depositing plates in a plurality of cassettes stacked vertically;

(2) a sliding step for horizontally moving one of said cassettes in a multiple cassette station, said one of said cassettes having a plate to be used for recording images;

(3) a vertically moving step for vertically moving, with said lift mechanism, said one of said cassettes having been moved horizontally, to a plate feed position for feeding the plates to said image recording apparatus; and (4) a plate transporting step for picking up the plate, with a transport mechanism, from said one of said cassettes placed in said plate feed position, and transporting the plates to said image recording apparatus.

9. A plate feeding method as defined in claim 8, further comprising a strip sheet discharging step executed after the plate transporting step for discharging strip sheets each disposed between an adjacent pair of said plates from said one of said cassettes placed in said plate feed position.

10. A plate feeding method as defined in claim 8, wherein the sliding step is executed, after aligning a second guide attached to a lift member of said lift mechanism and one of first guides of said slide mechanism corresponding in number to said cassettes, for horizontally guiding said one of said cassettes with said first and second guides.

* * * * *